(12) United States Patent
Onishi (10) Patent No.: US 7,825,768 B2
(45) Date of Patent: Nov. 2, 2010

(54) RESISTOR CIRCUIT AND OSCILLATION CIRCUIT

(75) Inventor: Kota Onishi, Nagoya (JP)

(73) Assignee: Seiko Epson Corporation (JP)

( * ) Notice: Subject to any disclaimer, the term of this patent is extended or adjusted under 35 U.S.C. 154(b) by 443 days.

(21) Appl. No.: 12/069,868

(22) Filed: Feb. 12, 2008

(65) Prior Publication Data
US 2008/0197965 A1    Aug. 21, 2008

(30) Foreign Application Priority Data
Feb. 20, 2007    (JP) .............................. 2007-039669

(51) Int. Cl.
*H01C 10/00* (2006.01)
(52) U.S. Cl. ...................... 338/195; 338/320; 338/295; 257/529; 257/629; 438/60; 438/228
(58) Field of Classification Search .................. 338/195, 338/254, 319–320, 295; 257/529, 629, 633, 257/467; 438/60, 228, 922
See application file for complete search history.

(56) References Cited

U.S. PATENT DOCUMENTS 7,292,133 B2 *  11/2007  Kato .......................... 338/195

2002/0003483 A1 *  1/2002  Hashimoto et al. .......... 341/121
2004/0190348 A1 *  9/2004  Cioaca et al. .......... 365/189.06
2004/0262768 A1   12/2004  Cho et al.

FOREIGN PATENT DOCUMENTS

JP        2005-019989        1/2005

* cited by examiner

*Primary Examiner*—Kyung Lee
(74) *Attorney, Agent, or Firm*—Harness, Dickey & Pierce, P.L.C.

(57) ABSTRACT

A resistor circuit includes first to Mth resistor circuit units. A (2j−1)th resistor circuit unit includes a (2j−1)th first fuse element and a (2j−1)th resistor provided in series between a (2j−1)th node and a 2jth node, and a (2j−1)th second fuse element provided in parallel with the (2j−1)th first fuse element and the (2j−1)th resistor between the (2j−1)th node and the 2jth node. A 2jth resistor circuit unit includes a 2jth first fuse element and a 2jth resistor provided in series between the 2jth node and a (2j+1)th node, and a 2jth second fuse element that is provided in parallel with the 2jth first fuse element and the 2jth resistor between the 2jth node and the (2j+1)th node. The (2j−1)th first fuse element, the (2j−1)th second fuse element, the 2jth first fuse element, and the 2jth second fuse element are disposed in a fuse region. The (2j−1)th resistor is disposed in a first resistor region formed in a first direction with respect to the fuse region. The 2jth resistor is disposed in a second resistor region formed in a third direction with respect to the fuse region, the third direction being a direction opposite to the first direction.

15 Claims, 11 Drawing Sheets

| $R_3$ (4R) | $R_2$ (2R) | $R_1$ (R) | $HA_3$ | $HB_3$ | $HA_2$ | $HB_2$ | $HA_1$ | $HB_1$ | Rtotal |
|---|---|---|---|---|---|---|---|---|---|
| 0 (NOT SELECTED) | 0 | 0 | × (BLOWN) | ○ (NOT BLOWN) | × | ○ | × | ○ | 3RH |
| 0 | 0 | 1 (SELECTED) | × | ○ | × | ○ | ○ | × | 3RH+R |
| 0 | 1 | 0 | × | ○ | ○ | × | × | ○ | 3RH+2R |
| 0 | 1 | 1 | × | ○ | ○ | × | ○ | × | 3RH+3R |
| 1 | 0 | 0 | ○ | × | × | ○ | × | ○ | 3RH+4R |
| 1 | 0 | 1 | ○ | × | × | ○ | ○ | × | 3RH+5R |
| 1 | 1 | 0 | ○ | × | ○ | × | × | ○ | 3RH+6R |
| 1 | 1 | 1 | ○ | × | ○ | × | ○ | × | 3RH+7R |

FIG. 5B

| $R_3$ (4R) | $R_2$ (2R) | $R_1$ (R) | $HA_3$ | $HB_3$ | $HA_2$ | $HB_2$ | $HA_1$ | $HB_1$ | Rtotal |
|---|---|---|---|---|---|---|---|---|---|
| 0 (NOT SELECTED) | 0 | 0 | × (BLOWN) | ○ (NOT BLOWN) | × | ○ | × | ○ | 3RH+6RP |
| 0 | 0 | 1 (SELECTED) | × | ○ | × | ○ | ○ | × | 3RH+6RP+R |
| 0 | 1 | 0 | × | ○ | ○ | × | × | ○ | 3RH+6RP+2R |
| 0 | 1 | 1 | × | ○ | ○ | × | ○ | × | 3RH+6RP+3R |
| 1 | 0 | 0 | ○ | × | × | ○ | × | ○ | 3RH+6RP+4R |
| 1 | 0 | 1 | ○ | × | × | ○ | ○ | × | 3RH+6RP+5R |
| 1 | 1 | 0 | ○ | × | ○ | × | × | ○ | 3RH+6RP+6R |
| 1 | 1 | 1 | ○ | × | ○ | × | ○ | × | 3RH+6RP+7R |

RESISTOR CIRCUIT AND OSCILLATION CIRCUIT

Japanese Patent Application No. 2007-39669 filed on Feb. 20, 2007, is hereby incorporated by reference in its entirety.

BACKGROUND OF THE INVENTION

The present invention relates to a resistor circuit, an oscillation circuit, and the like.

A CR oscillation circuit is used as a circuit which generates a clock signal used in an integrated circuit device. The CR oscillation circuit includes a feedback resistor, a feedback capacitor, and a plurality of stages of inverter circuits.

The frequency of the clock signal generated by the CR oscillation circuit is set based on the resistance of the feedback resistor and the capacitance of the feedback capacitor. Therefore, it is necessary to accurately adjust the resistance of the feedback resistor in order to increase the accuracy of the frequency of the clock signal generated. A resistor circuit having fuse elements may be used as the feedback resistor. Specifically, the resistance of the feedback resistor is variably adjusted by blowing (melting) the fuse element using a laser or the like so that the desired clock frequency is achieved. Patent Document 1 (JP-A-2005-19989) discloses related-art technology relating to a fuse element.

When using a resistor circuit having fuse elements, the chip area of the integrated circuit device increases as the layout area of the resistor circuit increases. When using a polysilicon wire as a wire provided across a guard ring formed to enclose the arrangement region of the fuse elements, the adjustment accuracy of the resistance of the resistor circuit deteriorates due to the parasitic resistance of the polysilicon wire.

SUMMARY

According to one aspect of the invention, there is provided a resistor circuit comprising: first to Mth (M is an integer equal to or larger than two) resistor circuit units that are provided in series between a first node and an (M+1)th node, a (2j−1)th (1≦2j−1<M) resistor circuit unit among the first to Mth resistor circuit units including:

a (2j−1)th first fuse element and a (2j−1)th resistor that are provided in series between a (2j−1)th node and a 2jth node; and a (2j−1)th second fuse element that is provided in parallel with the (2j−1)th first fuse element and the (2j−1)th resistor between the (2j−1)th node and the 2jth node;

a 2jth resistor circuit unit among the first to Mth resistor circuit units including:

a 2jth first fuse element and a 2jth resistor that are provided in series between the 2jth node and a (2j+1)th node; and a 2jth second fuse element that is provided in parallel with the 2jth first fuse element and the 2jth resistor between the 2jth node and the (2j+1)th node;

the (2j−1)th first fuse element, the (2j−1)th second fuse element, the 2jth first fuse element, and the 2jth second fuse element being disposed in a fuse region;

the (2j−1)th resistor being disposed in a first resistor region that is formed in a first direction with respect to the fuse region; and the 2jth resistor being disposed in a second resistor region that is formed in a third direction with respect to the fuse region, the third direction being a direction opposite to the first direction.

According to another aspect of the invention, there is provided a resistor circuit comprising:

a plurality of fuse elements that are disposed in a fuse region; and a plurality of resistors that are disposed in a resistor region, each of the plurality of resistors being connected to a corresponding fuse elements among the plurality of fuse elements, the plurality of fuse elements being disposed inside a guard ring that is formed in the fuse region;

each of the plurality of resistors being formed of one or more polysilicon resistor units; and wires that are provided across the guard ring being formed of polysilicon wire units having a shape that is identical to that of the polysilicon resistor units.

According to another aspect of the invention, there is provided an oscillation circuit comprising:

a feedback resistor that includes the above resistor circuit;

a feedback capacitor; and a plurality of inverter circuits.

DETAILED DESCRIPTION OF THE EMBODIMENT

Aspects of the invention may provide a resistor circuit which enables an accurate resistance adjustment and a reduction in circuit area, and an oscillation circuit including the same.

According to one embodiment of the invention, there is provided a resistor circuit comprising: first to Mth (M is an integer equal to or larger than two) resistor circuit units that are provided in series between a first node and an (M+1)th node, a (2j−1)th (1≦2j−1<M) resistor circuit unit among the first to Mth resistor circuit units including:

a (2j−1)th first fuse element and a (2j−1)th resistor that are provided in series between a (2j−1)th node and a 2jth node; and a (2j−1)th second fuse element that is provided in parallel with the (2j−1)th first fuse element and the (2j−1)th resistor between the (2j−1)th node and the 2jth node;

a 2jth resistor circuit unit among the first to Mth resistor circuit units including:

a 2jth first fuse element and a 2jth resistor that are provided in series between the 2jth node and a (2j+1)th node; and a 2jth second fuse element that is provided in parallel with the 2jth first fuse element and the 2jth resistor between the 2jth node and the (2j+1)th node;

the (2j−1)th first fuse element, the (2j−1)th second fuse element, the 2jth first fuse element, and the 2jth second fuse element being disposed in a fuse region;

the (2j−1)th resistor being disposed in a first resistor region that is formed in a first direction with respect to the fuse region; and the 2jth resistor being disposed in a second resistor region that is formed in a third direction with respect to the fuse region, the third direction being a direction opposite to the first direction.

According to this embodiment, the (2j−1)th first fuse element and a (2j−1)th resistor are provided in series between the (2j−1)th node and the 2jth node, and the (2j−1)th second fuse element is provided in parallel with the (2j−1)th first fuse element and the (2j−1)th resistor. Therefore, the parasitic resistance between the (2j−1)th node and the 2jth node can be made equal between the case of blowing the first fuse element and the case of blowing the second fuse element, whereby an accurate resistance adjustment can be implemented.

According to this embodiment, the (2j−1)th first fuse element, the (2j−1)th second fuse element, the 2jth first fuse element, and the 2jth second fuse element are disposed in the fuse region. The (2j−1)th resistor is disposed in the first resistor region formed in the first direction with respect to the fuse region. The 2jth resistor is disposed in the second resistor region formed in the third direction with respect to the fuse region. Therefore, a wire which connects the resistors can be efficiently provided, whereby the area of the resistor circuit can be reduced.

In the resistor circuit according to this embodiment, when a direction perpendicular to the first direction is referred to as a second direction, the (2j−1)th first fuse element, the (2j−1)th second fuse element, the 2jth first fuse element, and the 2jth second fuse element may be disposed in the fuse region along the second direction.

This enables the fuse elements to be easily blown, whereby the fuse element blowing step can be simplified, for example.

In the resistor circuit according to this embodiment, the (2j−1)th first fuse element, the (2j−1)th second fuse element, the 2jth first fuse element, and the 2jth second fuse element may be disposed inside a guard ring that is formed in the fuse region;

each of the (2j−1)th resistor and the 2jth resistor may be formed of one or more polysilicon resistor units; and wires that are provided across the guard ring may be formed of polysilicon wire units having a shape that is identical to that of the polysilicon resistor units.

According to the configuration, an accurate resistance adjustment can be also be implemented when using the polysilicon wire as the wire provided across the guard ring.

In the resistor circuit according to this embodiment, a first wire portion that forms a wire connecting the (2j−1)th node and the (2j−1)th first fuse element and is provided across the guard ring, a second wire portion that forms a wire connecting the (2j−1)th node and the (2j−1)th second fuse element and is provided across the guard ring, a third wire portion that forms a wire connecting the (2j−1)th first fuse element and the (2j−1)th resistor and is provided across the guard ring, a fourth wire portion that forms a wire connecting the (2j−1)th second fuse element and the 2jth node and is provided across the guard ring, a fifth wire portion that forms a wire connecting the 2jth node and the 2jth first fuse element and is provided across the guard ring, a sixth wire portion that forms a wire connecting the 2jth node and the 2jth second fuse element and is provided across the guard ring, a seventh wire portion that forms a wire connecting the 2jth first fuse element and the 2jth resistor and is provided across the guard ring, and an eighth wire portion that forms a wire connecting the 2jth second fuse element and the (2j+1)th node and is provided across the guard ring may be formed of the polysilicon wire units having a shape that is identical to that of the polysilicon resistor units.

In the resistor circuit according to this embodiment, the polysilicon resistor units and the polysilicon wire units may be disposed so that a longitudinal direction coincides with the first direction.

An adverse effect of a process variation on the resistance adjustment can be reduced by disposing the polysilicon resistor units and the polysilicon wire units along the same direction in this manner.

In the resistor circuit according to this embodiment, a resistance ratio of the (2j−1)th resistor and the 2jth resistor may be a multiple of two.

This increases the resistance adjustment efficiency.

In the resistor circuit according to this embodiment, the resistor circuit further may include at least one initial adjustment resistor that is provided between the first node and the (M+1)th node.

According to the configuration, measurement using the initial adjustment resistor can be conducted before blowing the fuse element, and and a fuse element which is blown can be specified based on the measurement result.

In the resistor circuit according to this embodiment, a (2j−1)th second resistor may be provided between the (2j−1)th second fuse element and the 2jth node, and a 2jth second resistor may be provided between the 2jth second fuse element and the (2j+1)th node.

According to another embodiment of the invention, there is provided a resistor circuit comprising:

a plurality of fuse elements that are disposed in a fuse region; and a plurality of resistors that are disposed in a resistor region, each of the plurality of resistors being connected to a corresponding fuse elements among the plurality of fuse elements, the plurality of fuse elements being disposed inside a guard ring that is formed in the fuse region;

each of the plurality of resistors being formed of one or more polysilicon resistor units; and wires that are provided across the guard ring being formed of polysilicon wire units having a shape that is identical to that of the polysilicon resistor units.

According to this embodiment, since the polysilicon wire unit used as the wire provided across the guard ring has a shape identical to that of the polysilicon resistor unit, an accurate resistance adjustment can be also be implemented when using the polysilicon wire as the wire provided across the guard ring.

In the resistor circuit according to this embodiment, the polysilicon resistor units and the polysilicon wire units may be disposed so that a longitudinal direction coincides with a first direction.

According to another embodiment of the invention, there is provided an oscillation circuit comprising:

a feedback resistor that includes one of the resistor circuits;
a feedback capacitor; and
a plurality of inverter circuits.

Preferred embodiments of the invention are described below in detail. Note that the embodiments described below do not in any way limit the scope of the invention defined by the claims laid out herein. Note that all elements of the embodiments described below should not necessarily be taken as essential requirements for the invention.

1. Resistor Circuit

Figure 1:
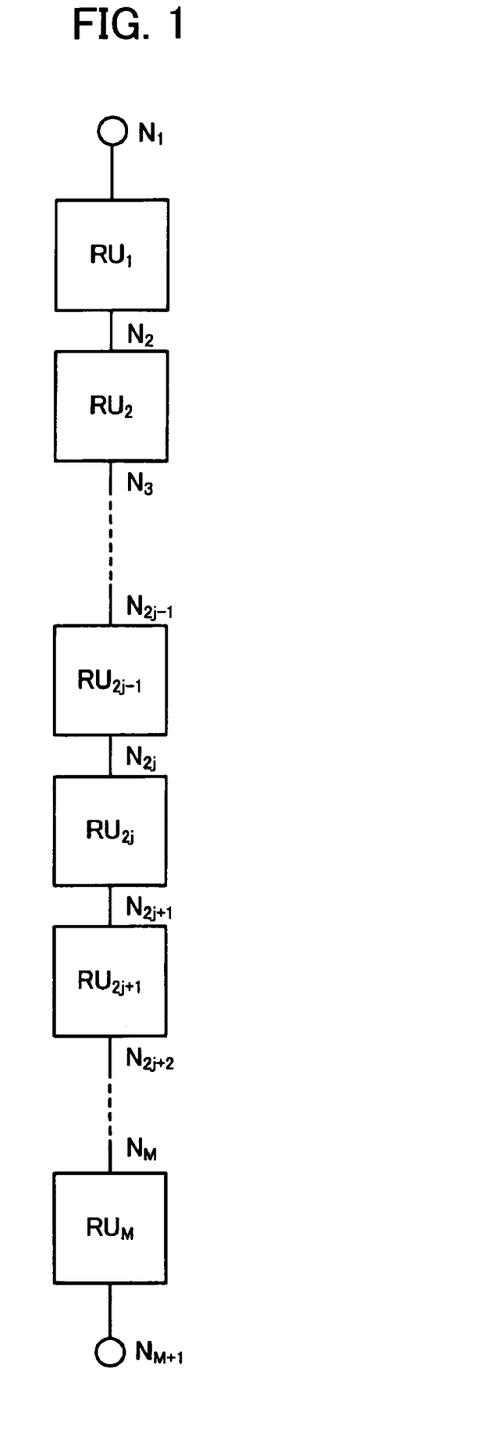
FIG. 1 shows a configuration example of a resistor circuit according to one embodiment of the invention.

FIG. 1 shows a configuration example of a resistor circuit according to one embodiment of the invention. As shown in FIG. 1, the resistor circuit (variable resistor circuit or fuse circuit) according to this embodiment includes resistor circuit units $RU_1$ to $RU_M$ (first to Mth resistor circuit units; M is an integer equal to or larger than two) provided in series between a node $N_1$ (first node) and a node $N_{M+1}$ ((M+1)th node). Specifically, the resistor circuit includes the resistor circuit unit $RU_1$ provided between the nodes $N_1$ and $N_2$, the resistor circuit unit $RU_2$ provided between the nodes $N_2$ and $N_3$, . . . , the resistor circuit unit $RU_{2j-1}$ provided between the nodes $N_{2j-1}$ and $N_{2j}$, the resistor circuit unit $RU_{2j}$ provided between the nodes $N_{2j}$ and $N_{2j+1}$, . . . , and the resistor circuit unit $RU_M$ provided between the nodes $N_M$ and $N_{M+1}$. Each of the resistor circuit units $RU_1$ to $RU_M$ may include at least one resistor and at least two fuse elements.

Figure 2:
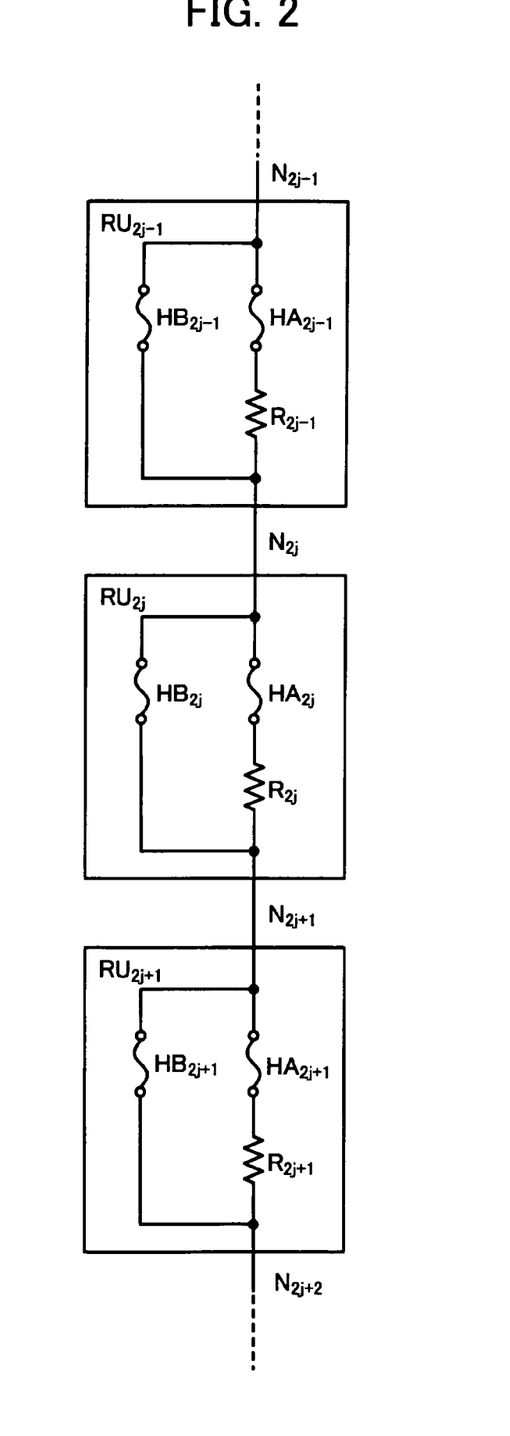
FIG. 2 shows a configuration example of a resistor circuit unit.

FIG. 2 shows a specific configuration example of the resistor circuit unit. As shown in FIG. 2, the resistor circuit unit $RU_{2j-1}$ ((2j−1)th resistor circuit unit; j is an arbitrary integer that satisfies 1≦2j−1<M) among the resistor circuit units $RU_1$ to $RU_M$ includes a first fuse element $HA_{2j-1}$ ((2j−1)th first fuse element) and a resistor $R_{2j-1}$ ((2j−1)th resistor) provided in series between the nodes $N_{2j-1}$ and $N_{2j}$. The resistor circuit unit $RU_{2j-1}$ also includes a second fuse element $HB_{2j-1}$ ((2j−1)th second fuse element) provided in parallel with the first fuse element $HA_{2j-1}$ and the resistor $R_{2j-1}$ between the nodes $N_{2j-1}$ and $N_{2j}$.

The resistor circuit unit $RU_{2j}$ (2jth resistor circuit unit) among the resistor circuit units $RU_1$ to $RU_M$ shown in FIG. 1 includes a first fuse element $HA_{2j}$ (2jth first fuse element) and a resistor $R_{2j}$ (2jth resistor) provided in series between the nodes $N_{2j}$ and $N_{2j+1}$. The resistor circuit unit $RU_{2j}$ also includes a second fuse element $HB_{2j}$ (2jth second fuse element) provided in parallel with the first fuse element $HA_{2j}$ and the resistor $R_{2j}$ between the nodes $N_{2j}$ and $N_{2j+1}$.

The first fuse element $HA_{2j-1}$ is a fuse element provided on the side of the resistor $R_{2j-1}$, and the second fuse element $HB_{2j-1}$ is a fuse element provided on the side differing from that of the resistor $R_{2j-1}$. When selecting the resistor $R_{2j-1}$, the second fuse element $HB_{2j-1}$ is blown without blowing the first fuse element $HA_{2j-1}$. Specifically, the second fuse element $HB_{2j-1}$ is melted (blown) using a laser or the like. This causes the resistance of the resistor $R_{2j-1}$ to be inserted between the nodes $N_{2j-1}$ and $N_{2j}$. On the other hand, when the resistor $R_{2j-1}$ is not selected, the first fuse element $HA_{2j-1}$ is blown without blowing the second fuse element $HB_{2j-1}$. Specifically, the first fuse element $HA_{2j-1}$ is melted using a laser or the like. This causes the resistor $R_{2j-1}$ to be bypassed so that the resistance of the resistor $R_{2j-1}$ is not inserted between the nodes $N_{2j-1}$ and $N_{2j}$.

Figure 3:
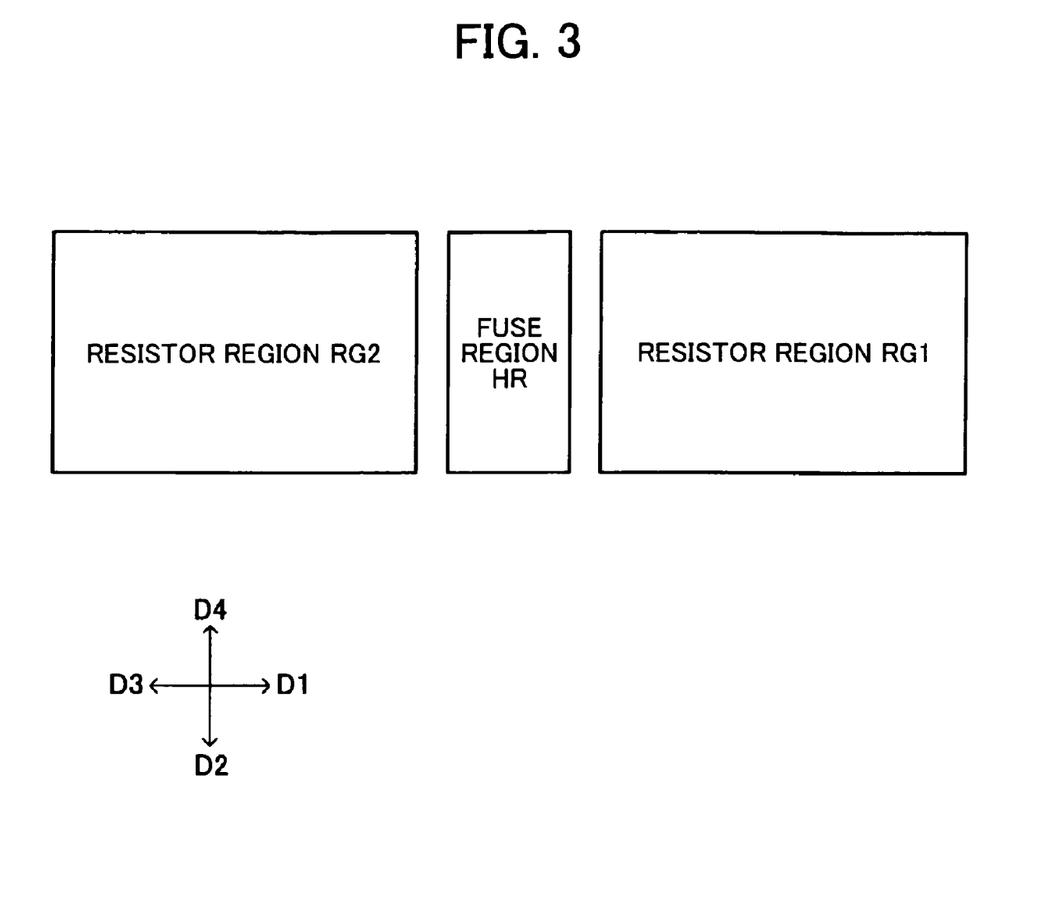
FIG. 3 is a schematic layout diagram of a resistor circuit.

FIG. 3 shows a schematic layout diagram showing the resistor circuit according to this embodiment. In FIG. 3, a direction perpendicular to a first direction D1 is a second direction D2, a direction opposite to the first direction D1 is a third direction D3, and a direction opposite to the second direction D2 is a fourth direction D4. Note that the directions D1 to D4 are arbitrary. For example, the direction D1 may be a leftward direction and the direction D3 may be a rightward direction, and the direction D2 may be an upward direction and the direction D4 may be a downward direction.

As shown in FIG. 3, a first resistor region RG1 is formed in the direction D1 with respect to a fuse region HR, and a second resistor region RG2 is formed in the direction D3 with respect to the fuse region HR. Specifically, the fuse region HR is formed between the first and second resistor regions RG1 and RG2. A plurality of resistors (polysilicon resistor units) of the resistor circuit are disposed in the first and second resistor regions RG1 and RG2, and a plurality of fuse elements of the resistor circuit are disposed in the fuse region HR.

Figure 4:
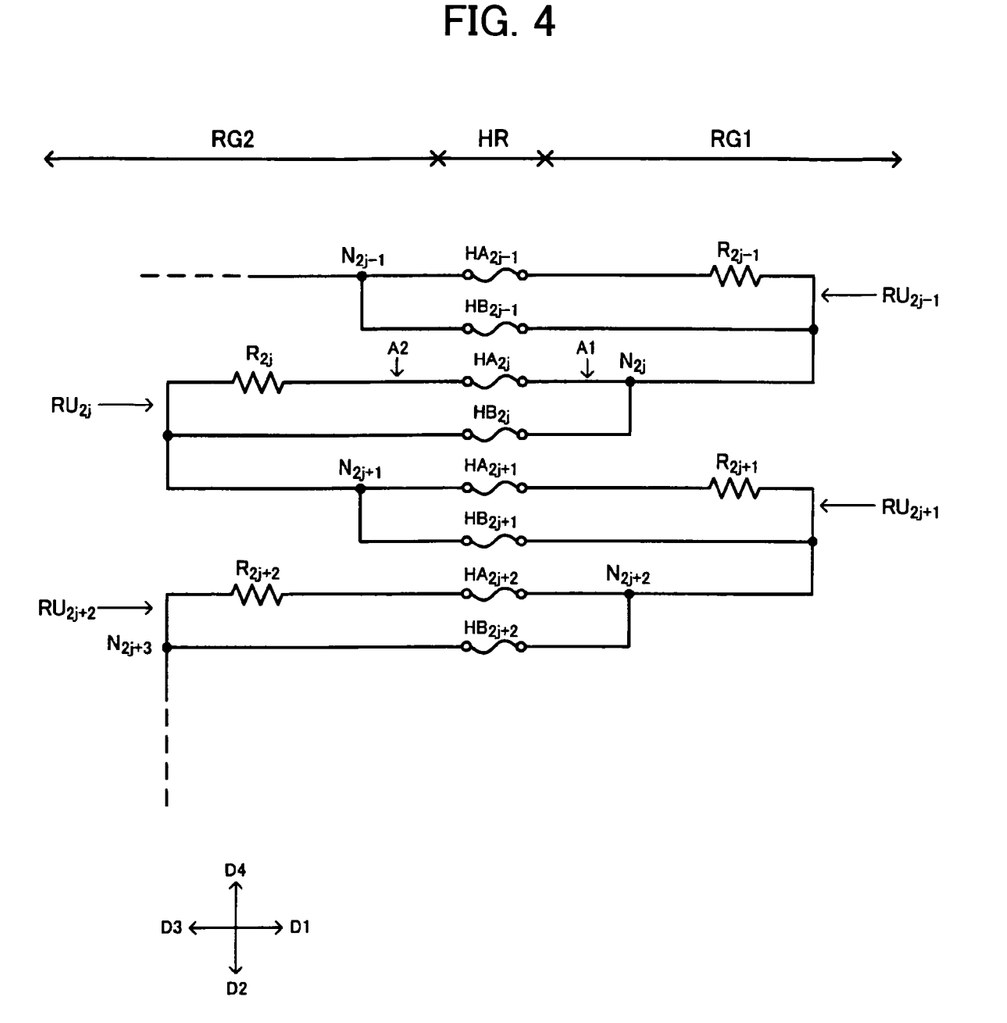
FIG. 4 is a view illustrative of the arrangement of fuse elements and resistors.

More specifically, the first fuse element $HA_{2j-1}$, the second fuse element $HB_{2j-1}$, the first fuse element $HA_{2j}$, and the second fuse element $HB_{2j}$ are disposed in the fuse region HR, as shown in FIG. 4.

The resistor $R_{2j-1}$ is disposed in the resistor region RG1 formed in the direction D1 with respect to the fuse region HR. Specifically, the odd-numbered resistor is disposed in the resistor region RG1. The resistor $R_{2j}$ is disposed in the resistor region RG2 formed in the direction D3 with respect to the fuse region HR. Specifically, the even-numbered resistor is disposed in the resistor region RG2.

The first fuse element $HA_{2j-1}$, the second fuse element $HB_{2j-1}$, the first fuse element $HA_{2j}$, and the second fuse element $HB_{2j}$ are linearly disposed in the fuse region HR along the direction D2.

The resistor circuit according to this embodiment shown in FIGS. 1 to 4 enables an increase in resistance adjustment accuracy and a reduction in circuit area. Specifically, the parasitic resistance of the fuse element is higher than that of a normal metal wire. Therefore, the adjustment accuracy of the resistance of the resistor circuit may deteriorate due to the parasitic resistance of the fuse element.

In the resistor circuit according to this embodiment, since the first fuse element $HA_{2j-1}$ and the second fuse element $HB_{2j-1}$ are provided in parallel between the nodes $N_{2j-1}$ and $N_{2j}$ shown in FIG. 4, for example, the resistance can be adjusted with high accuracy even if the fuse element has a parasitic resistor.

Suppose the case where the resistor circuit includes the resistor circuit units $RU_1$, $RU_2$, and $RU_3$ connected in series between the nodes $N_1$ and $N_4$, for example. The resistor circuit unit $RU_1$ includes the resistor $R_1$ (=$R_{2j-1}$), the fuse element $HA_1$(=$HA_{2j-1}$), and the fuse element $HB_1$(=$HB_{2j-1}$), the resistor circuit unit $RU_2$ includes the resistor $R_2$ (=$R_{2j}$), the fuse element $HA_2$ (=$HA_{2j}$), and the fuse element $HB_2$ (=$HB_{2j}$), and the resistor circuit unit $RU_3$ includes the resistor $R_3$ (=$R_{2j+1}$), the fuse element $HA_3$ (=$HA_{2j+1}$), and the fuse element $HB_3$ (=$HB_{2j+1}$). The resistances of the resistors $R_1$, $R_2$, and $R_3$ are respectively R, 2R, and 4R, and the parasitic resistance of the fuse elements $HA_1$, $HB_1$, $HA_2$, $HB_2$, $HA_3$, and $HB_3$ is RH.

Figure 5A:
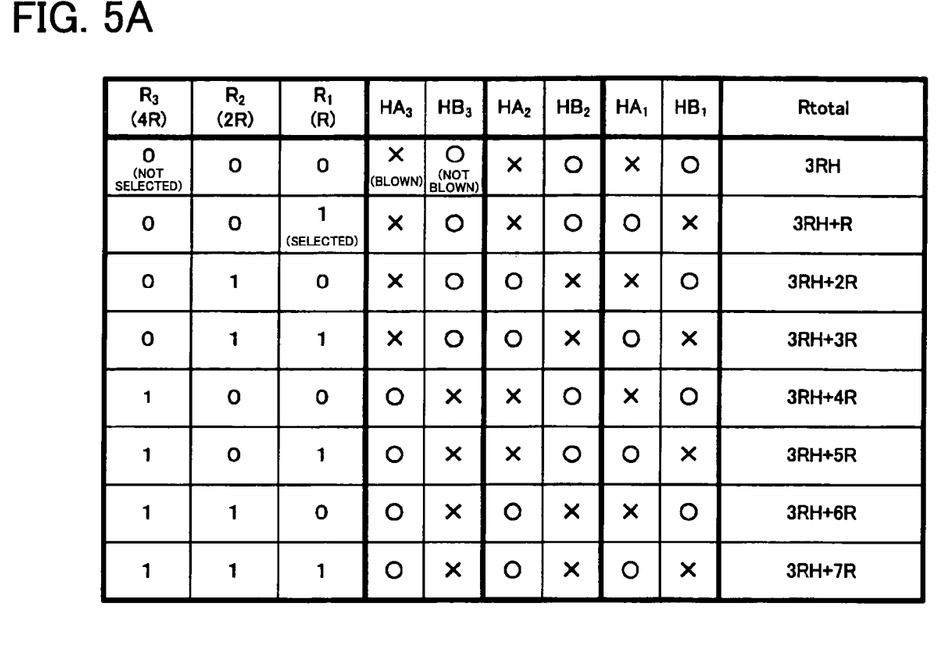
FIGS. 5A and 5B are views illustrative of calculations of the total resistance.

In this case, when fuse data which sets the blowout state of the fuse element is (000) so that the resistors $R_3$, $R_2$, and $R_1$ are not selected, as shown in FIG. 5A, the fuse elements $HA_3$, $HA_2$, and $HA_1$ are blown, and the fuse elements $HB_3$, $HB_2$, and $HB_1$ are not blown. Therefore, the total resistance $R_{TOTAL}$ of the resistor circuit (i.e., resistance between the nodes $N_1$ and $N_4$) is 3RH. Specifically, since the resistors $R_3$, $R_2$, and $R_1$ are not inserted between the nodes $N_1$ and $N_4$, the total resistance between the nodes $N_1$ and $N_4$ equals the resistance obtained by serially connecting the parasitic resistors of the three fuse elements $HB_3$, $HB_2$, and $HB_1$ (i.e., $R_{TOTAL}$=3RH).

When the fuse data is (001) so that only the resistor $R_1$ is selected, the fuse elements $HA_3$, $HA_2$, and $HB_1$ are blown, and the fuse elements $HB_3$, $HB_2$, and $HA_1$ are not blown. In this case, the total resistance $R_{TOTAL}$ is 3RH+R. Likewise, when the fuse data is (010), (011), (100), (101), (110), or (111), the total resistance $R_{TOTAL}$ is 3RH+2R, 3RH+3R, 3RH+4R, 3RH+5R, 3RH+6R, or 3RH+7R, respectively.

According to this embodiment, since the resistance 3RH is necessarily added to the resistance $R_{TOTAL}$ irrespective of the value of the fuse data, the resistance can be adjusted with high accuracy. Specifically, the difference in resistance between the case where the fuse data is (000) and the case where the fuse data is (001) is R, and the difference in resistance between the case where the fuse data is (001) and the case where the fuse data is (010) is also R (i.e., the resistance corresponding to the LSB is necessarily R). Therefore, the linearity of the resistance when the fuse data changes in the order of (000), (001), . . . , and (111) can be increased so that the resistance of the resistor circuit can be accurately adjusted to a desired value.

According to this embodiment, the odd-numbered resistor $R_{2j-1}$ ($R_{2j+1}$) is disposed in the resistor region RG1 in the direction D1 with respect to the fuse region HR, and the even-numbered resistor $R_{2j}$ ($R_{2j+2}$) is disposed in the resistor region RG2 in the direction D3 with respect to the fuse region HR, as shown in FIG. 4. A wire indicated by A1 in FIG. 4 which is connected to the node $N_{2j}$ connected to one end of the resistor $R_{2j-1}$ is connected to one end of the fuse elements $HA_{2j}$ and $HB_{2j}$, and a wire indicated by A2 which is connected to the other end of the fuse elements $HA_{2j}$ and $HB_{2j}$ is connected to one end of the resistor $R_{2j}$ or the node $N_{2j+1}$. Therefore, since the wire which connects the resistors is efficiently provided, the area of the resistor circuit can be reduced.

As a comparative example of this embodiment, a method may be considered in which the odd-numbered resistor $R_{2j-1}$ and the even-numbered resistor $R_{2j}$ are disposed in the resistor region RG1. According to this method, an unnecessary wiring region is required for providing the wire indicated by A2 which connects the other end of the fuse elements $HA_{2j}$ and $HB_{2j}$ to one end of the resistor $R_{2j}$ or the node $N_{2j+1}$ from the resistor region RG2 to the resistor region RG1, whereby the area of the resistor circuit increases.

According to this embodiment, the wire indicated by A2 can be directly connected to the resistor $R_{2j}$ or the node $N_{2j+1}$ in the resistor region RG2. This eliminates an unnecessary wiring region, whereby the area of the resistor circuit can be reduced.

2. Polysilicon Wire Unit

Figure 6:
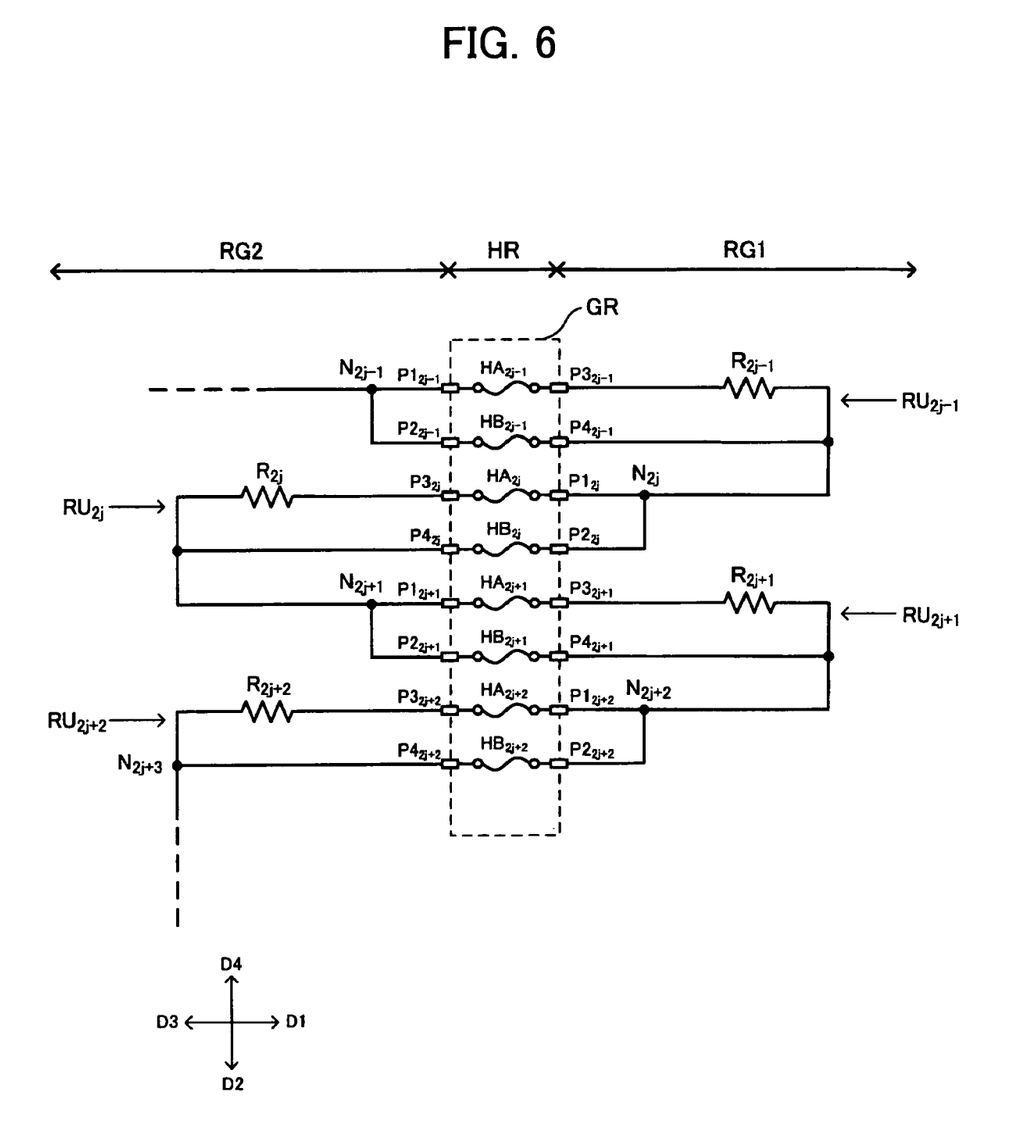
FIG. 6 is a view illustrative of the arrangement of fuse elements and resistors.

In FIG. 6, the first fuse element $HA_{2j-1}$, the second fuse element $HB_{2j-1}$, the first fuse element $HA_{2j}$, and the second fuse element $HB_{2j}$ are disposed inside a fuse guard ring GR formed in the fuse region HR. Specifically, the guard ring GR is formed along the outer edge of the fuse region HR. The guard ring GR is formed of a plurality of metal wiring layers (e.g., aluminum wiring layers), for example. Or, the guard ring is formed of a contact layer which connects a plurality of metal wiring layers.

For example, a fuse window described later is formed in a region in which the fuse elements may be blown. Therefore, moisture from the outside may enter the interface circuit through the fuse window (i.e., interlayer dielectric exposed in the fuse window), thereby causing deterioration, destruction, or the like of the internal circuit.

In this case, when the guard ring GR is formed outside the fuse elements, as shown in FIG. 6, the guard ring GR serves as a barrier to prevent entrance of moisture or the like from the outside, so that deterioration, destruction, or the like of the internal circuit can be prevented.

When the guard ring GR is provided, the wire which connects the resistor and the fuse element or the like necessarily has a wire portion provided across the guard ring GR. In this embodiment, a polysilicon wire unit provided in the same layer as a resistor polysilicon (polycrystalline silicon) unit of the resistor is used as such a wire portion, for example. Specifically, a polysilicon wire unit is used which has the same shape (including almost the same shape) as the polysilicon resistor unit.

In FIG. 6, a first wire portion $P1_{2j-1}$ is a wire portion which forms a wire connecting the node $N_{2j-1}$ and the fuse element $HA_{2j-1}$ and is provided across the side of the guard ring GR disposed in the direction D3 with respect to the center of the guard ring GR, and a second wire portion $P2_{2j-1}$ is a wire portion which forms a wire connecting the node $N_{2j-1}$ and the fuse element $HB_{2j-1}$ and is provided across the side of the guard ring GR disposed in the direction D3 with respect to the center of the guard ring GR. A third wire portion $P3_{2j-1}$ is a wire portion which forms a wire connecting the fuse element $HA_{2j-1}$ and the resistor $R_{2j-1}$ and is provided across the side of the guard ring GR disposed in the direction D1 with respect to the center of the guard ring GR, and a fourth wire portion $P4_{2j-1}$ is a wire portion which forms a wire connecting the fuse element $HB_{2j-1}$ and the node $N_{2j}$ and is provided across the side of the guard ring GR disposed in the direction D1 with respect to the center of the guard ring GR.

A fifth wire portion $P1_{2j}$ is a wire portion which forms a wire connecting the node $N_{2j}$ and the fuse element $HA_{2j}$ and is provided across the side of the guard ring GR disposed in the direction D1 with respect to the center of the guard ring GR, and a sixth wire portion $P2_{2j}$ is a wire portion which forms a wire connecting the node $N_{2j}$ and the fuse element $HB_{2j}$ and is provided across the side of the guard ring GR disposed in the direction D1 with respect to the center of the guard ring GR. A seventh wire portion $P3_{2j}$ is a wire portion which forms a wire connecting the fuse element $HA_{2j}$ and the resistor $R_{2j}$ and is provided across the side of the guard ring GR disposed in the direction D3 with respect to the center of the guard ring GR, and an eighth wire portion $P4_{2j}$ is a wire portion which forms a wire connecting the fuse element $HB_{2j}$ and the node $N_{2j+1}$ and is provided across the side of the guard ring GR disposed in the direction D3 with respect to the center of the guard ring GR.

In FIG. 6, the wire portions $P1_{2j-1}$, $P2_{2j-1}$, $P3_{2j-1}$, $P4_{2j-1}$, $P1_{2j}$, $P2_{2j}$, $P3_{2j}$, $P4_{2j}$, and the like are formed of polysilicon wire units having the same shape as the polysilicon resistor units which form the resistors $R_{2j-1}$, $R_{2j}$, and the like. This further increases the adjustment accuracy of the resistance of the resistor circuit.

Figure 7:
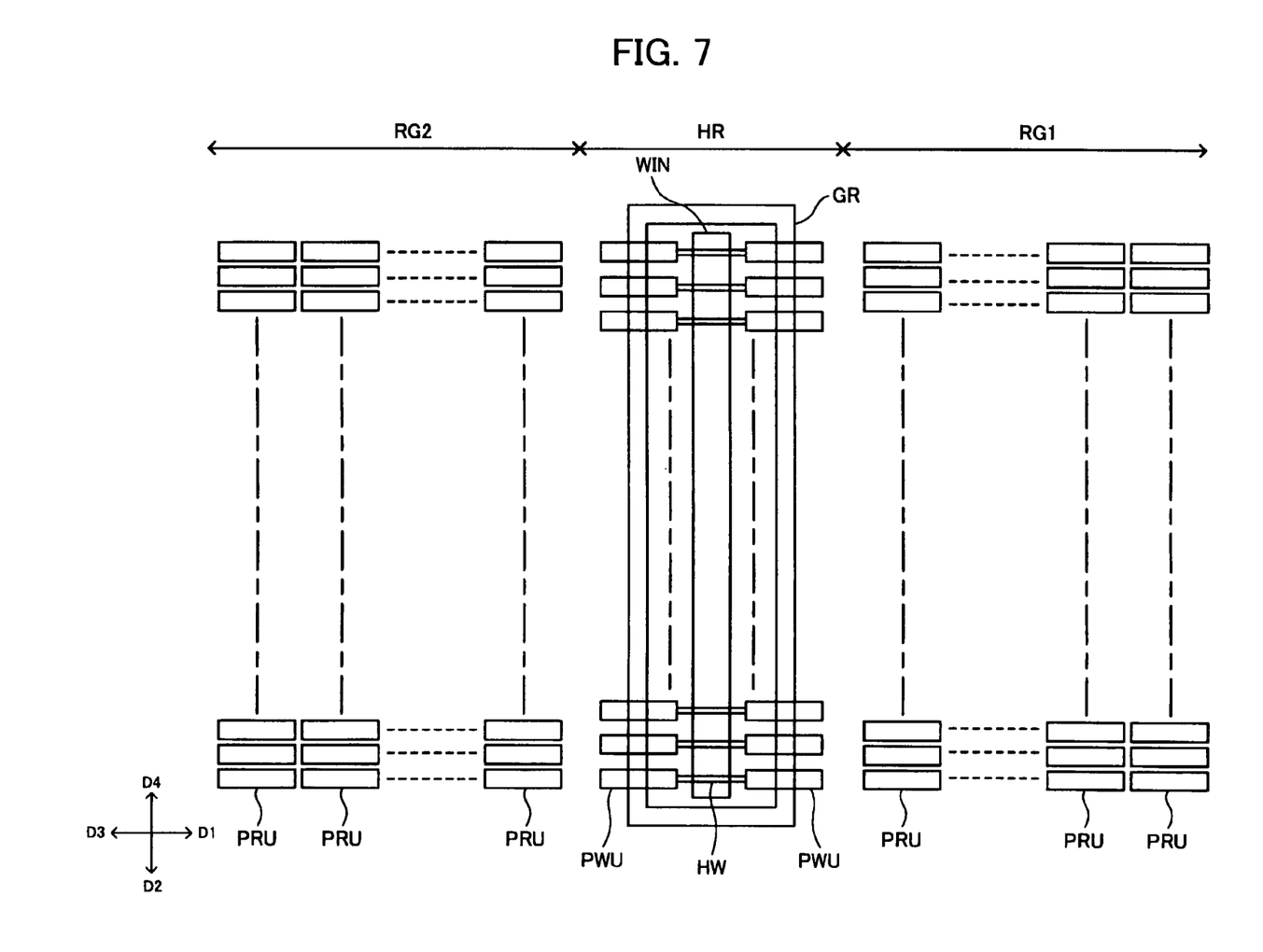
FIG. 7 is a detailed layout diagram of a resistor circuit.

FIG. 7 shows a detailed layout example of the resistor circuit. Polysilicon resistor units PRU are disposed in the resistor regions RG1 and RG2 in a matrix, the longitudinal direction (long side direction) of the polysilicon resistor units PRU coinciding with the direction D1. The resistors $R_{2j-1}$, $R_{2j}$, $R_{2j+1}$, and $R_{2j+2}$ shown in FIG. 6 are formed by connecting the polysilicon resistor units adjacent in the direction D1 using a metal wire such as an aluminum wire. Some of the polysilicon resistor units disposed in the resistor regions RG1 and RG2 may be dummy resistor units which are not connected with the polysilicon resistor units adjacent in the direction D1 and the metal wire.

Fuse wires HW forming the fuse elements are disposed in the fuse region HR so that the fuse wires HW are arranged along the direction D2. A rectangular fuse window WIN is formed in the region in which the fuse elements may be blown. The thickness of an interlayer dielectric is reduced in the fuse window WIN so that the fuse elements are easily blown, for example.

A rectangular guard ring GR is formed in the fuse region HR to enclose the fuse wires HW arranged along the direction D2. The polysilicon wire units PWU, of which the longitudinal direction coincides with the direction D1, are disposed on the left side and the right side of the guard ring GR along the direction D2 as wire portions provided across the guard ring GR. In this case, one end of the fuse wire HW is connected to the polysilicon wire unit disposed on the left side of the guard ring GR, and the other end of the fuse wire HW is connected to the polysilicon wire unit disposed on the right side of the guard ring GR.

Figure 8:
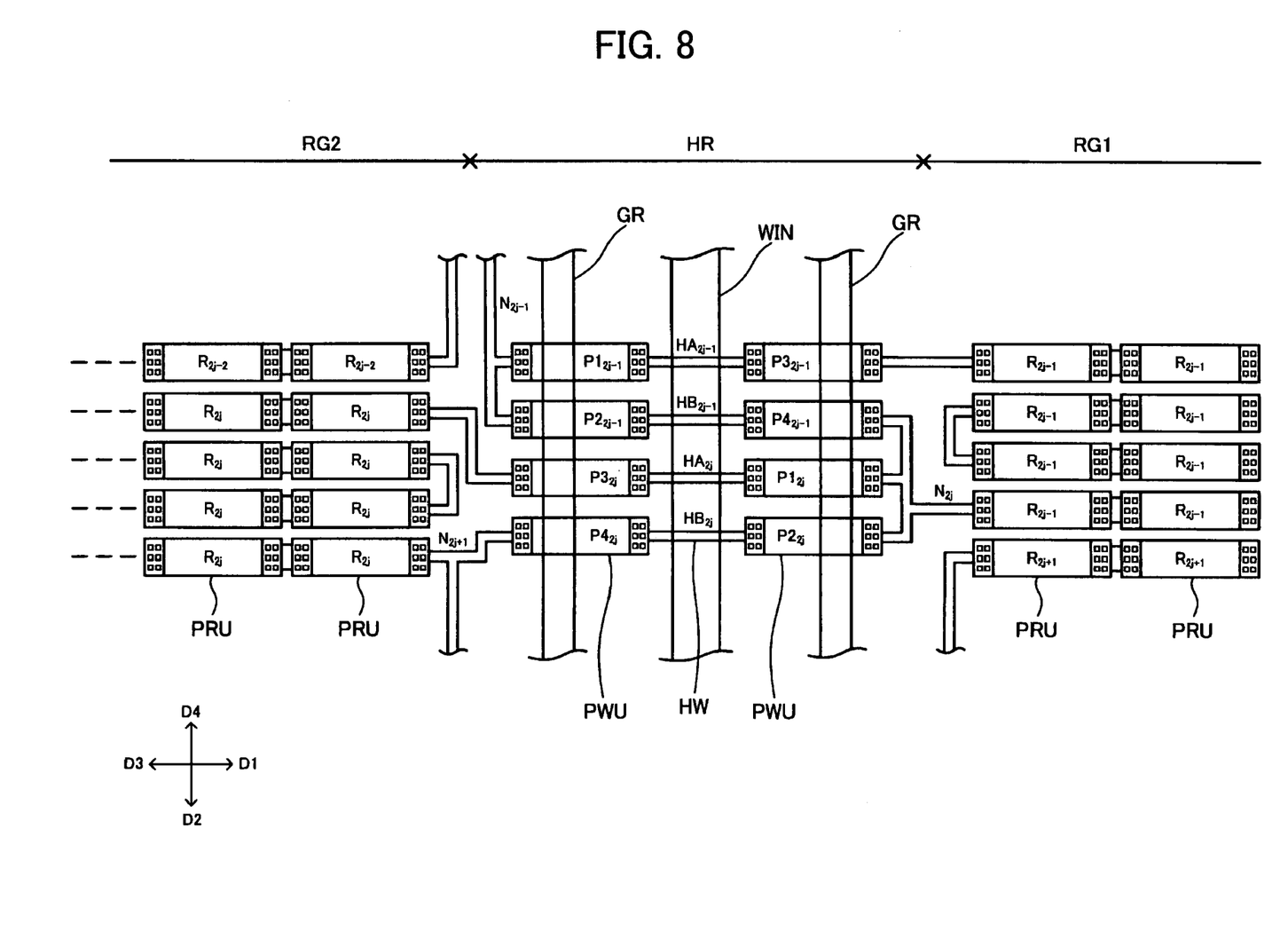
FIG. 8 is a further detailed layout diagram of a resistor circuit.

FIG. 8 shows a further detailed layout example of the resistor circuit. FIG. 8 is a partially enlarged view of FIG. 7.

The node $N_{2j-1}$ is connected to one end of the wire portion $P1_{2j-1}$ and $P2_{2j-1}$ formed of the polysilicon wire units PWU. The other end of the wire portions $P1_{2j-1}$ and $P2_{2j-1}$ is connected to one end of the fuse elements $HA_{2j-1}$ and $HB_{2j-1}$ formed of the fuse wires HW. The other end of the fuse elements $HA_{2j-1}$ and $HB_{2j-1}$ is connected to one end of the wire portions $P3_{2j-1}$ and $P4_{2j-1}$ formed of the polysilicon wire units PWU. The other end of the wire portions $P3_{2j-1}$ and $P4_{2j-1}$ is connected to one end of the resistor $R_{2j-1}$ formed of a plurality of polysilicon resistor units PRU.

The node $N_{2j}$ connected to the other end of the resistor $R_{2j-1}$ is connected to one end of the wire portions $P1_{2j}$ and $P2_{2j}$ formed of the polysilicon wire units PWU. The other end of the wire portions $P1_{2j}$ and $P2_{2j}$ is connected to one end of the fuse elements $HA_{2j}$ and $HB_{2j}$ formed of the fuse wires HW. The other end of the fuse elements $HA_{2j}$ and $HB_{2j}$ is connected to one end of the wire portions $P3_{2j}$ and $P4_{2j}$ formed of the polysilicon wire units PWU. The other end of the wire portions $P3_{2j-1}$ and $P4_{2j-1}$ is connected to one end of the resistor $R_{2j}$ formed of a plurality of polysilicon resistor units PRU. The other end of the resistor $R_{2j}$ is connected to the node $N_{2j+1}$.

According to the method shown in FIGS. 6 to 8, an accurate resistance adjustment can be also be implemented when using the polysilicon wire as the wire provided across the guard ring.

Specifically, the parasitic resistance of the polysilicon wire is higher than that of a normal metal wire. Therefore, the adjustment accuracy of the resistance of the resistor circuit may deteriorate due to the parasitic resistance of the polysilicon wire.

According to the method shown in FIGS. 6 to 8, since the first fuse element $HA_{2j-1}$ and the second fuse element $HB_{2j-1}$ are provided in parallel between the nodes $N_{2j-1}$ and $N_{2j}$, for example, the resistance can be adjusted with high accuracy even if the fuse element has a parasitic resistor.

Figure 5B:
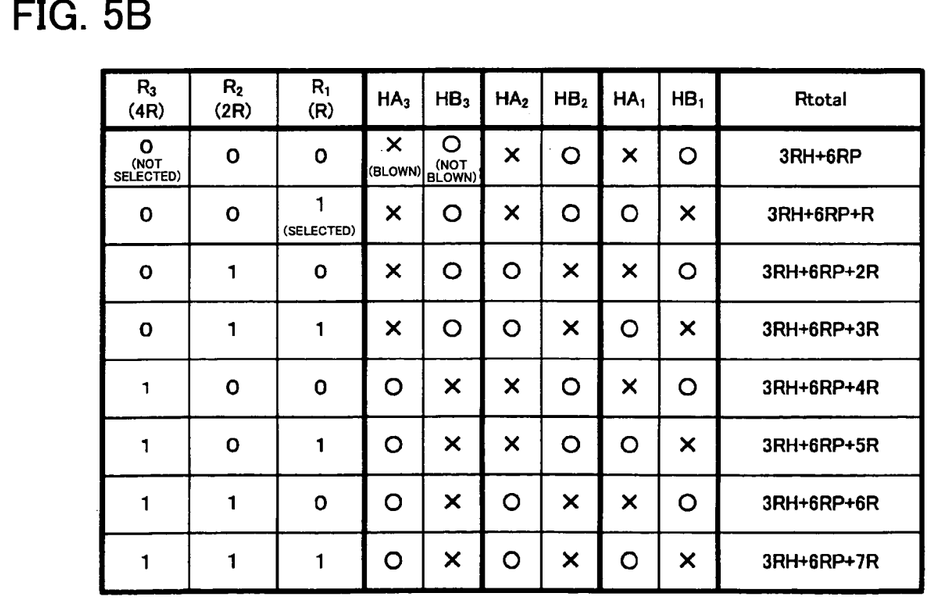

For example, in FIG. 5B, suppose that the resistor circuit includes the resistor circuit units $RU_1$, $RU_2$, and $RU_3$ connected in series between the nodes $N_1$ and $N_4$ in the same manner as in FIG. 5A. The resistances of the resistors $R_1$, $R_2$, and $R_3$ of the resistor circuit units $RU_1$, $RU_2$, and $RU_3$ are respectively R, 2R, and 4R, and the parasitic resistance of the fuse elements $HA_1$, $HB_1$, $HA_2$, $HB_2$, $HA_3$, and $HB_3$ is RH. The resistance (sheet resistance) of the polysilicon wire unit PWU is RP. Since the polysilicon wire unit PWU and the polysilicon resistor unit PRU have an identical shape, the polysilicon resistor unit PRU also has a resistance RP.

In this case, when the fuse data is (000) so that the fuse elements $HA_3$, $HA_2$, and $HA_1$ are blown, the total resistance $R_{TOTAL}$ of the resistor circuit is 3RH+6RP. Specifically, since the resistors $R_3$, $R_2$, and $R_1$ are not inserted between the nodes $N_1$ and $N_4$, the total resistance equals the resistance obtained when serially connecting the parasitic resistors of the three fuse elements $HB_3$, $HB_2$, $HB_1$ and the six polysilicon wire units PWU (i.e., $R_{TOTAL}$=3RH+6RP). Note that the resistance RH may be disregarded when the resistance RH is sufficiently smaller than the resistance RP. In this case, the total resistance RTOTAL is 6RP.

When the fuse data is (001) so that only the resistor $R_1$ is selected, the total resistance RTOTAL is 3RH+6RP+R (or 6RP+R). Likewise, when the fuse data is (010), (011), (100), (101), (110), or (111), the total resistance $R_{TOTAL}$ is 3RH+6RP+2R, 3RH+6RP+3R, 3RH+6RP+4R, 3RH+6RP+5R, 3RH+6RP+6R, or 3RH+6RP+7R, respectively.

According to this embodiment, the resistance of two serially connected polysilicon wire units is necessarily added between the nodes when either the first fuse element HA or the second fuse element HB is blown. Therefore, since the resistance 6RP is necessarily added to the resistance $R_{TOTAL}$ irrespective of the value of the fuse data, the linearity of the resistance with respect to the fuse data can be increased so that the resistance of the resistor circuit can be accurately adjusted to a desired value.

According to this embodiment, since the polysilicon wire unit PWU and the polysilicon resistor unit PRU have an identical shape, a further accurate resistance adjustment can be performed. Specifically, when the sheet resistance of the polysilicon wire increases due to a process variation or the like, the resistances of the polysilicon wire unit PWU and the polysilicon resistor unit PRU increase similarly since the polysilicon wire unit PWU and the polysilicon resistor unit PRU are formed to have an identical shape. When the sheet resistance of the polysilicon wire decreases due to a process variation or the like, the resistances of the polysilicon wire unit PWU and the polysilicon resistor unit PRU decrease similarly. Therefore, since the resistance ratio of the polysilicon wire unit PWU and the polysilicon resistor unit PRU does not change from unity, the resistance adjustment accuracy can be increased.

In FIGS. 7 and 8, the polysilicon wire units PWU and the polysilicon resistor units PRU are disposed so that the longitudinal direction coincides with the direction D1. Therefore, the resistance ratio of the polysilicon wire unit PWU and the polysilicon resistor unit PRU can be maintained at a constant value even if a mask alignment error, etching nonuniformity, or the like occurs, whereby the resistance adjustment accuracy can be further increased.

The method which forms the polysilicon wire unit PWU and the polysilicon resistor unit PRU to have an identical shape may also be applied to a resistor circuit having a circuit configuration differing from that of the resistor circuit having a circuit configuration described with reference to FIGS. 1 to 4. Specifically, this method may be applied to a resistor circuit which includes a plurality of fuse elements disposed in a fuse region and a plurality of resistors which are disposed in a resistor region and each of which is connected to each of the fuse elements, wherein the fuse elements are disposed inside a guard ring formed in the fuse region. In this case, each of the resistors may be formed of one or more polysilicon resistor units, and a wire provided across the guard ring may be formed of a polysilicon wire unit having a shape identical to that of the polysilicon resistor unit.

3. Specific Example of Resistor Circuit

Figure 9:
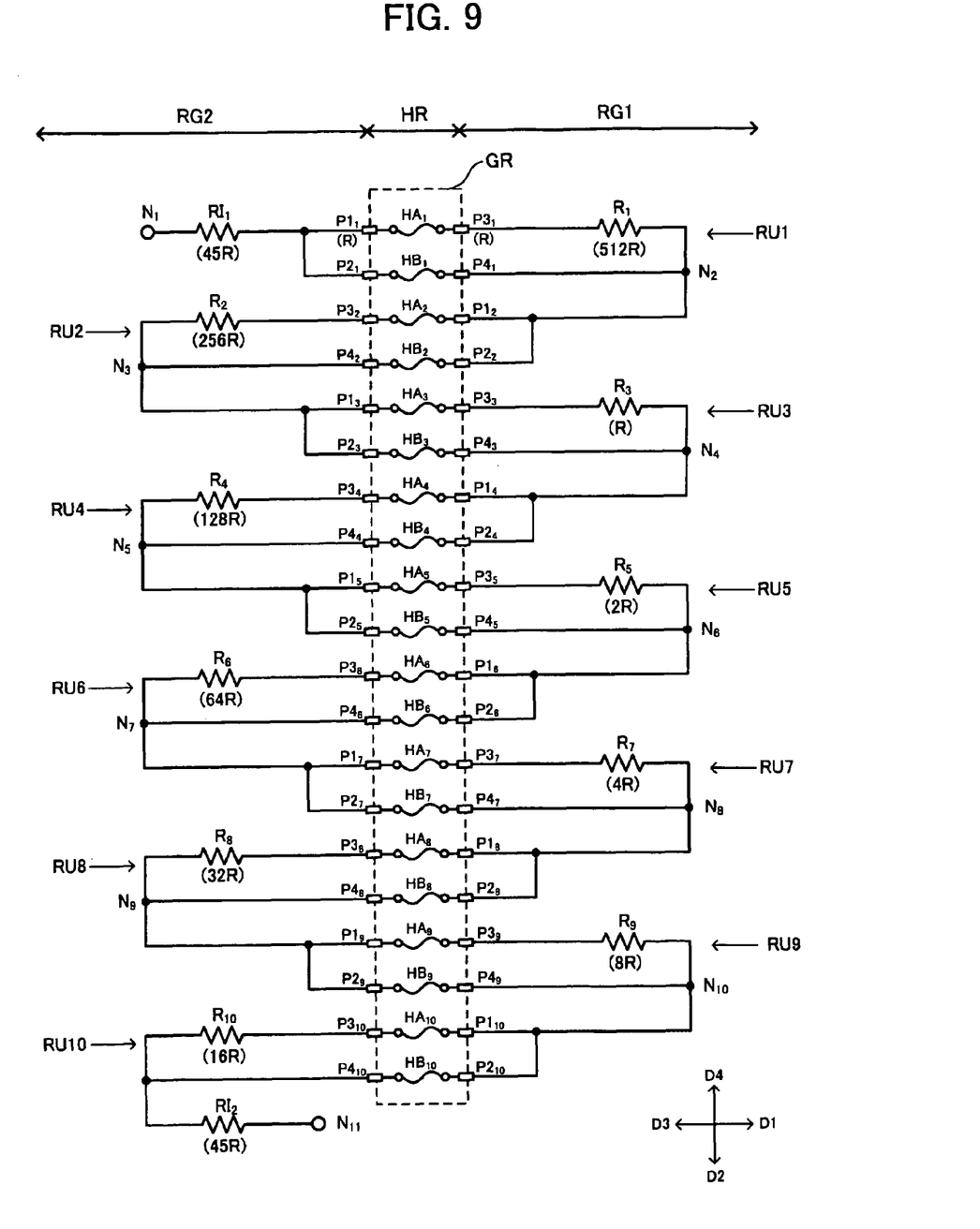
FIG. 9 shows a specific example of a resistor circuit.

FIG. 9 shows a specific example of the resistor circuit. The resistor circuit shown in FIG. 9 includes resistor circuit units $RU_1$ to $RU_{10}$ connected in series between nodes $N_1$ and $N_{11}$. When the resistance of the polysilicon resistor unit is R, the resistances of resistors $R_1$ to $R_{10}$ included in the resistor circuit units $RU_1$ to $RU_{10}$ are set at 512R, 256R, R, 128R, 2R, 64R, 4R, 32R, 8R, and 16R, respectively. Specifically, the resistance ratio (i.e., resistance ratio of (2j−1)th resistor $R_{2j-1}$ and 2jth resistor $R_{2j}$) of the resistors $R_1$ to $R_{10}$ is a multiple of two. The resistance of the polysilicon wire units which form wire portions $P1_1$ to $P4_{10}$ is R, which is the same as the resistance of the polysilicon resistor unit.

In FIG. 9, the resistor $R_1$ (512R) having the highest resistance is disposed in a resistor region RG1, and the resistor $R_2$ (256R) having the second highest resistance is disposed in a resistor region RG2. The resistor $R_4$ (128R), $R^6$ (64R), $R^8$ (32R), and $R^{10}$ (16R) having the third to sixth resistances are disposed in the resistor region RG2, and the resistors $R_3$ (R), $R_5$ (2R), $R_7$ (4R), and $R_9$ (8R) having the tenth to seventh resistances are disposed in the resistor region RG1. According to this configuration, the number of polysilicon resistor units disposed in the resistor region RG1 and the number of polysilicon resistor units disposed in the resistor region RG2 can be made equal (or almost equal), whereby the layout efficiency can be increased.

In this embodiment, at least one initial adjustment resistor may be provided between the first node and the (M+1)th node. In FIG. 9, a first initial adjustment resistor $RI_1$ is provided between the node $N_1$ (first node in a broad sense) and the first resistor circuit unit $RU_1$, and a second initial adjustment resistor $RI_2$ is provided between the Mth resistor circuit unit $RU_M$ and the node $N1_{11}$ ((M+1)th node in a broad sense). The initial adjustment resistors $RI_1$ and $RI_2$ are formed of a plurality of polysilicon resistor units in the same manner as resistors $R_1$ to $R_{10}$. In FIG. 9, each of the initial adjustment resistors $RI_1$ and $RI_2$ is formed of 45 polysilicon resistor units and has a resistance of 45R. The resistance of the resistor circuit can be efficiently adjusted by providing the initial adjustment resistors $RI_1$ and $RI_2$.

For example, suppose that the resistor circuit according to this embodiment is used for an oscillation circuit shown in FIG. 11 described later. In this case, the oscillation circuit is caused to perform an oscillation operation using the resistor circuit in which all the fuse elements are not blown as a feedback resistor during an initial setting step before a step of blowing the fuse elements. An initial oscillation cycle T0 of the oscillation circuit in the initial setting step is measured using an external tester or the like.

The resistance between the nodes $N_1$ and $N_{11}$ when all the fuse elements shown in FIG. 9 are not blown is referred to as R0. The resistance R0 is a value obtained by summing up the resistance 45R of the first initial adjustment resistor $RI_1$, the resistance 45R of the second initial adjustment resistor $RI_2$, and the resistances of the resistor circuit units $RU_1$ to $RU_{10}$ when the fuse elements are not blown. For example, the resistance of the resistor circuit unit $RU_1$ when the fuse elements are not blown is equal to a value obtained by parallelly connecting a resistor having a resistance of 2R+512R and a resistor having a resistance of 2R. This also applies to the resistor circuit units $RU_2$ to $RU_{10}$.

When a target oscillation cycle of the oscillation circuit is TOB when measuring the initial oscillation cycle T0 in this state, an adjustment target resistance ROB is calculated according to the following equation (1).

$$ROB=(TOB/T0)\times R0 \quad (1)$$

A value HDATA when the resistance ROSC of the resistor circuit coincides with the adjustment target resistance ROB is calculated according to the following equation (2). A fuse element which is blown is specified by the value HDATA, and the specified fuse element is blown.

$$ROSC=ROB=45R+45R+2R\times 10+HDATA\times R \quad (2)$$

In the equation (2), 45R is the resistance of the initial adjustment resistors $RI_1$ and $RI_2$. $2R\times 10$ is the total resistance of the wire portions $P1_1$ to $P4_{10}$ formed of the polysilicon wire units (resistance R). Specifically, $2R\times 10$ is the resistance of the serially connected 20 (=2×10) polysilicon wire units. In this embodiment, the total resistance of the wire portions $P1_1$ to $P4_{10}$ formed of the polysilicon wire units is necessarily $2R\times 10$ irrespective of whether the first fuse element HA or the second fuse element HB is blown. The parasitic resistance of the fuse element is smaller than that of the polysilicon wire unit and is disregarded.

The value HDATA is the value of the fuse data in decimal representation. For example, HDATA=1 when the 10-bit fuse data is (0000000001), HDATA=2 when the 10-bit fuse data is (0000000010), and HDATA=3 when the 10-bit fuse data is (0000000011).

Therefore, when HDATA=1 is obtained by the equations (1) and (2), the resistor $R_3$ (R) is selected by blowing the fuse element $HB_3$, and the resistors $R_1$, $R_2$, and $R_4$ to $R_{10}$ are not selected by blowing the fuse elements $HA_1$, $HA_2$, and $HA_4$ to $HA_{10}$. Therefore, when HDATA=2 is obtained by the equations (1) and (2), the resistor $R_5$ (2R) is selected by blowing the fuse element $HB_5$, and the resistors $R_1$ to $R_4$ and $R_6$ to $R_{10}$ are not selected by blowing the fuse elements $HA_1$ to $HA_4$ and $HA_6$ to $HA_{10}$.

The resistance of the resistor circuit can be adjusted to a desired value using the simple method described using the equations (1) and (2) by providing the initial adjustment resistors $RI_1$ and $RI_2$, whereby the efficiency of the adjusting process can be increased.

4. Modification

Figure 10:
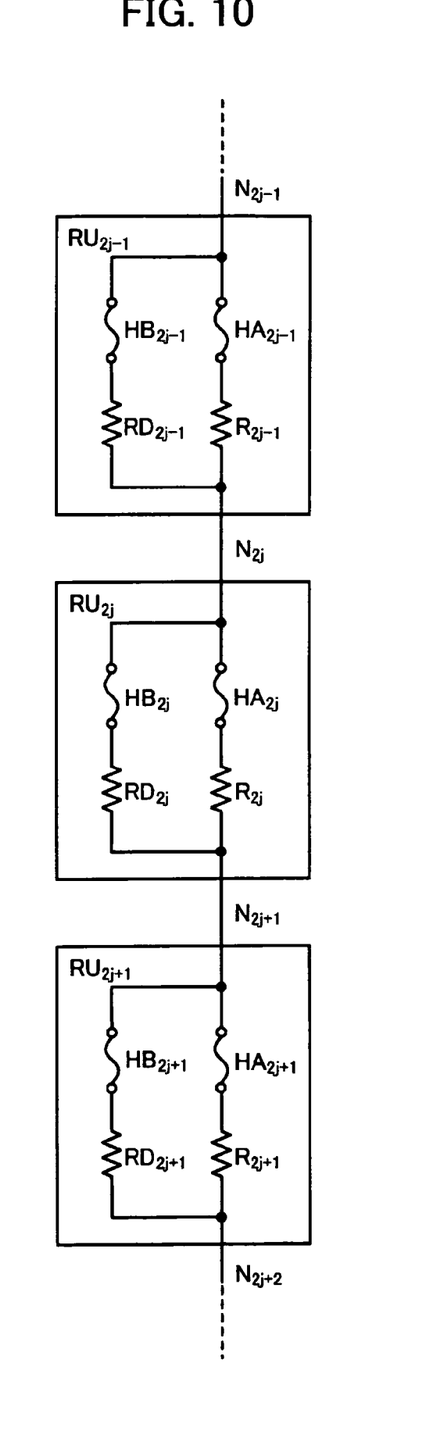
FIG. 10 shows a configuration example of a resistor circuit according to a modification.

FIG. 10 shows a modification of the resistor circuit according to this embodiment. In this modification, resistors $RD_{2j-1}$, $RD_{2j}$, and $RD_{2j+1}$ are added to the circuit shown in FIG. 2. The (2j−1)th second resistor $RD_{2j-1}$ is a resistor provided between the (2j−1)th second fuse element $HB_{2j-1}$ and the 2jth node $N_{2j}$, and the 2jth second resistor $RD_{2j}$ is a resistor provided between the 2jth second fuse element $HB_{2j}$ and the (2j+1)th node $N_{2j+1}$.

In FIG. 10, the resistor $R_{2j-1}$ is selected when the second fuse element $HB_{2j-1}$ is blown, and the second resistor $RD_{2j}$ is selected when the first fuse element $HA_{2j-1}$ is blown, for example. Likewise, the resistor $R_{2j}$ is selected when the second fuse element $HB_{2j}$ is blown, and the second resistor $RD_{2j}$ is selected when the first fuse element $HA_{2j}$ is blown.

The arrangement method and the adjustment method according to this embodiment described with reference to FIGS. 1 to 9 and the like may also be employed for the resistor circuit shown in FIG. 10. For example, the resistor arrangement method described with reference to FIGS. 3 and 4 and the polysilicon wire unit arrangement method described with reference to FIGS. 6 to 8 may be employed.

The resistor circuit unit according to this embodiment is not limited to the configurations shown in FIGS. 2 and 10. Various modifications may be made such as omitting some of the elements, adding other elements, or changing the connection relationship.

5. Oscillation Circuit

Figure 11:
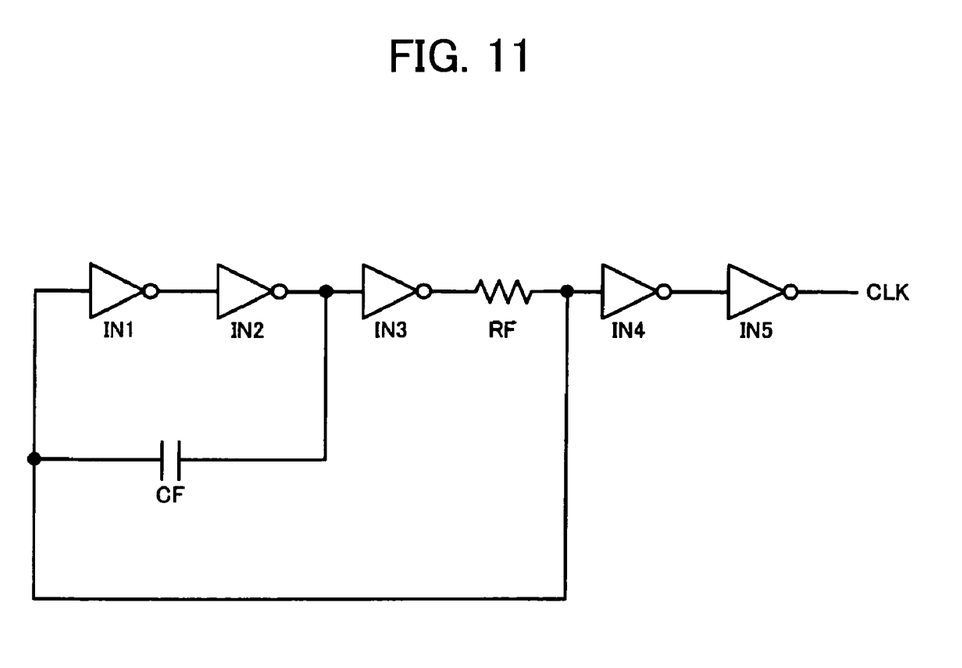
FIG. 11 shows a configuration example of an oscillation circuit using a resistor circuit according to one embodiment of the invention.

FIG. 11 shows a circuit configuration example of an oscillation circuit utilizing the resistor circuit according to this embodiment. The oscillation circuit includes a plurality of (odd stage) inverter circuits IN1, IN2, and IN3. The oscillation circuit also includes a feedback resistor RF formed using the resistor circuit according to this embodiment and a feedback capacitor CF. Inverter circuits IN4 and IN5 function as buffer circuits for outputting a clock signal CLK of which the waveform is shaped.

In FIG. 11, the output of the inverter circuit IN2 is fed back to the input of the inverter circuit IN1 through the feedback capacitor CF. The output of the inverter circuit IN3 is fed back to the input of the inverter circuit IN1 through the feedback resistor RF. The oscillation circuit shown in FIG. 11 performs a CR oscillation operation at a frequency corresponding to the capacitance of the feedback capacitor CF and the resistance of the feedback resistor RF.

The resistance of the feedback resistor RF can be accurately adjusted by applying the resistor circuit according to this embodiment described with reference to FIGS. 1 to 10 to the oscillation circuit shown in FIG. 11, whereby the adjustment accuracy of the frequency of the clock signal CLK output from the oscillation circuit can be increased.

The oscillation circuit using the resistor circuit according to this embodiment is not limited to the configuration shown in FIG. 11. Various modifications may be made such as omitting some of the elements, adding other elements, or changing the connection relationship. The circuit to which the resistor circuit according to this embodiment is applied is not limited to the oscillation circuit. The resistor circuit according to this embodiment may also be applied to various circuits such as a power supply circuit, a voltage regulation circuit, and a current regulation circuit.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings. The invention also includes any combination of the above embodiments and modifications. The configurations and the arrangement of the resistor circuit and the oscillation circuit, the polysilicon unit arrangement method, and the resistance adjustment method are not limited to those described in the above embodiments. Various modifications and variations may be made.

What is claimed is:

1. A resistor circuit comprising: first to Mth (M is an integer equal to or larger than two) resistor circuit units that are provided in series between a first node and an (M+1)th node,
   a (2j−1)th (1≦2i−1<M) resistor circuit unit among the first to Mth resistor circuit units including:
   a (2j−1)th first fuse element and a (2j−1)th resistor that are provided in series between a (2j−1)th node and a 2jth node; and
   a (2j−1)th second fuse element that is provided in parallel with the (2j−1)th first fuse element and the (2j−1)th resistor between the (2j−1)th node and the 2jth node;
   a 2jth resistor circuit unit among the first to Mth resistor circuit units including:
   a 2jth first fuse element and a 2jth resistor that are provided in series between the 2jth node and a (2j+1)th node; and
   a 2jth second fuse element that is provided in parallel with the 2jth first fuse element and the 2jth resistor between the 2jth node and the (2j+1)th node;
   the (2j−1)th first fuse element, the (2j−1)th second fuse element, the 2jth first fuse element, and the 2jth second fuse element being disposed in a fuse region;
   the (2j−1)th resistor being disposed in a first resistor region that is formed in a first direction with respect to the fuse region; and
   the 2jth resistor being disposed in a second resistor region that is formed in a third direction with respect to the fuse region, the third direction being a direction opposite to the first direction.

2. The resistor circuit as defined in claim 1, when a direction perpendicular to the first direction is referred to as a second direction, the (2j−1)th first fuse element, the (2j−1)th second fuse element, the 2jth first fuse element, and the 2jth second fuse element being disposed in the fuse region along the second direction.

3. The resistor circuit as defined in claim 1,
   the (2j−1)th first fuse element, the (2j−1)th second fuse element, the 2jth first fuse element, and the 2jth second fuse element being disposed inside a guard ring that is formed in the fuse region;
   each of the (2j−1)th resistor and the 2jth resistor being formed of one or more polysilicon resistor units; and
   wires that are provided across the guard ring being formed of polysilicon wire units having a shape that is identical to that of the polysilicon resistor units.

4. The resistor circuit as defined in claim 3,
   a first wire portion that forms a wire connecting the (2j−1)th node and the (2j−1)th first fuse element and is provided across the guard ring, a second wire portion that forms a wire connecting the (2j−1)th node and the (2j−1)th second fuse element and is provided across the guard ring, a third wire portion that forms a wire connecting the (2j−1)th first fuse element and the (2j−1)th resistor and is provided across the guard ring, a fourth wire portion that forms a wire connecting the (2j−1)th second fuse element and the 2jth node and is provided across the guard ring, a fifth wire portion that forms a wire connecting the 2jth node and the 2jth first fuse element and is provided across the guard ring, a sixth wire portion that forms a wire connecting the 2jth node and the 2jth second fuse element and is provided across the guard ring, a seventh wire portion that forms a wire connecting the 2jth first fuse element and the 2jth resistor and is provided across the guard ring, and an eighth wire portion that forms a wire connecting the 2jth second fuse element and the (2j+1)th node and is provided across the guard ring being formed of the polysilicon wire units having a shape that is identical to that of the polysilicon resistor units.

5. The resistor circuit as defined in claim 3, the polysilicon resistor units and the polysilicon wire units being disposed so that a longitudinal direction coincides with the first direction.

6. The resistor circuit as defined in claim 4, the polysilicon resistor units and the polysilicon wire units being disposed so that a longitudinal direction coincides with the first direction.

7. The resistor circuit as defined in claim 1, a resistance ratio of the (2j−1)th resistor and the 2jth resistor being a multiple of two.

8. The resistor circuit as defined in claim 1, the resistor circuit further including at least one initial adjustment resistor that is provided between the first node and the (M+1)th node.

9. The resistor circuit as defined in claim 1, a (2j−1)th second resistor being provided between the (2j−1)th second fuse element and the 2jth node, and a 2jth second resistor being provided between the 2jth second fuse element and the (2j+1)th node.

10. A resistor circuit comprising:
    a plurality of fuse elements that are disposed in a fuse region; and
    a plurality of resistors that are disposed in a resistor region, each of the plurality of resistors being connected to a corresponding fuse element among the plurality of fuse elements,
    the plurality of fuse elements being disposed inside a guard ring that is formed in the fuse region;
    each of the plurality of resistors being formed of one or more polysilicon resistor units; and wires that are provided across the guard ring being formed of polysilicon wire units having a shape that is identical to that of the polysilicon resistor units.

11. The resistor circuit as defined in claim 10, the polysilicon resistor units and the polysilicon wire units being disposed so that a longitudinal direction coincides with a first direction.

12. An oscillation circuit comprising:
a feedback resistor that includes the resistor circuit as defined in claim 1;
a feedback capacitor; and
a plurality of inverter circuits.

13. An oscillation circuit comprising:
a feedback resistor that includes the resistor circuit as defined in claim 2;
a feedback capacitor; and
a plurality of inverter circuits.

14. An oscillation circuit comprising:
a feedback resistor that includes the resistor circuit as defined in claim 3;
a feedback capacitor; and
a plurality of inverter circuits.

15. An oscillation circuit comprising:
a feedback resistor that includes the resistor circuit as defined in claim 10;
a feedback capacitor; and
a plurality of inverter circuits.

* * * * *